United States Patent
Ward et al.

(10) Patent No.: US 9,432,038 B1
(45) Date of Patent: Aug. 30, 2016

(54) DIGITAL-TO-ANALOG CONVERTER USING NONLINEAR CAPACITANCE COMPENSATION

(71) Applicant: Broadcom Corporation, Irvine, CA (US)

(72) Inventors: Christopher Ward, The Netherlands (NL); Klaas Bult, Bosch en Duin (NL); Iniyavan Elumalai, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/706,543

(22) Filed: May 7, 2015

Related U.S. Application Data

(60) Provisional application No. 62/121,834, filed on Feb. 27, 2015.

(51) Int. Cl.
  *H03M 1/06* (2006.01)
  *H03M 1/66* (2006.01)
  *H03K 17/16* (2006.01)

(52) U.S. Cl.
  CPC ......... *H03M 1/0604* (2013.01); *H03K 17/165* (2013.01); *H03M 1/66* (2013.01)

(58) Field of Classification Search
  CPC ... H03M 1/0604; H03M 1/66; H03K 17/165
  USPC ......................................... 341/144, 118–120
  See application file for complete search history.

(56) References Cited

U.S. PATENT DOCUMENTS

| | | | | |
|---|---|---|---|---|
| 5,748,127 | A * | 5/1998 | Prakash | H03M 1/0604 327/541 |
| 2009/0167579 | A1* | 7/2009 | Kawano | H03M 1/0678 341/135 |
| 2013/0076549 | A1* | 3/2013 | Bajdechi | H03M 1/0607 341/144 |

OTHER PUBLICATIONS

Tille, et al., "Design of Low-Voltage MOSFET-Only ΣΔ Modulators in Standard Digital CMOS Technology," IEEE Transactions on Circuits and Systems, vol. 51, No. 1, Jan. 2004; pp. 96-109.
Wang, et al., "A Capacitance—Compensation Technique for Improved Linearity in CMOS Class-AB Power Amplifiers," IEEE Journal of Solid-State Circuits, vol. 39, No. 11, Nov. 2004; pp. 1927-1937.
Dongbing, et al., "Design of 16-bit 400MSPS Current Steering D/A Converter," IEEE 8th International Conference on ASIC, Oct. 20-23, 2009; pp. 1189-1192.
Kang et al., "A Dual-Mode RF CMOS Power Amplifier with Nonlinear Capacitance Compensation," 2013 Asia-Pacific Microwave Conference Proceedings, Nov. 5-8, 2013; pp. 778-780.

* cited by examiner

*Primary Examiner* — Jean B Jeanglaude
(74) *Attorney, Agent, or Firm* — Sterne, Kessler, Goldstein & Fox P.L.L.C.

(57) ABSTRACT

A semiconductor device fabrication operation is commonly used to manufacture one or more integrated circuits onto a semiconductor substrate. The semiconductor device fabrication operation forms one or more transistors onto an arrangement of fabrication layers to form the one or more integrated circuits which introduces unwanted capacitances, often referred to as parasitic capacitances, into the one or more transistors. The one or more integrated circuits include one or more compensation modules that, when combined with the parasitic capacitances of the one or more transistors, ideally linearizes the non-linearity caused by the parasitic capacitances of the one or more transistors. For example, the one or more compensation modules incorporate a non-linear or a piecewise linear transfer function that is inversely related to the parasitic capacitances of the one or more transistors.

20 Claims, 10 Drawing Sheets

DIGITAL-TO-ANALOG CONVERTER USING NONLINEAR CAPACITANCE COMPENSATION

CROSS-REFERENCE TO RELATED APPLICATIONS

The present application claims the benefit of U.S. Provisional Patent Appl. No. 62/121,834, filed Feb. 27, 2015, which is incorporated herein by reference in its entirety.

BACKGROUND

1. Field of Disclosure

The present disclosure generally relates to improving the linearity of an electronic circuit and including nonlinear capacitance compensation to improve the linearity of a digital-to-analog converter (DAC).

2. Related Art

The continued improvement of the semiconductor fabrication process has allowed manufacturers and designers to create smaller and more powerful electronic devices. These electronic devices have higher speed, more density, and consume less power than their predecessors. In its infancy, manufacturers and designers used a 10 µM semiconductor fabrication process while a 5 nm semiconductor fabrication process is contemplated in the future with the surface area of each node being halved every two years. These earlier semiconductor fabrication processes have allowed manufacturers and designers to place a few thousand semiconductor devices, such as transistors, onto a semiconductor substrate while newer semiconductor fabrication processes allow placement of more than a hundred million semiconductor devices onto the same size semiconductor substrate.

Ideally, these semiconductor devices operate in a linear manner having responses that are directly proportional to their stimuli. However, in practice, the semiconductor fabrication process often introduces unwanted capacitances, often referred to as parasitic capacitances, into the transistors as well as the interconnections between these transistors. These parasitic capacitances can affect the linearity of the electronic device. For example, a digital-to-analog converter (DAC) is an electronic circuit that converts a digital input signal from a digital representation in a digital signaling domain to an analog representation in the analog signaling domain to provide an analog output signal. Ideally, this DAC exhibits a linear input/output relationship such that the analog output signal is directly proportional to the digital input signal. However, in practice, the parasitic capacitances of the transistors of the DAC often introduce non-linearities into the DAC causing the analog output signal to no longer be directly proportional to the digital input signal making the analog output signal less predictable.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE DISCLOSURE

Overview

A semiconductor device fabrication operation is commonly used to manufacture one or more integrated circuits onto a semiconductor substrate. The semiconductor device fabrication operation forms one or more transistors onto an arrangement of fabrication layers to form the one or more integrated circuits which introduces unwanted capacitances, often referred to as parasitic capacitances, into the one or more transistors. The various systems and methods disclosed herein include one or more compensation modules that, when combined with the parasitic capacitances of the one or more transistors, ideally linearizes the non-linearity caused by the parasitic capacitances of the one or more transistors. For example, the compensation module of the present disclosure incorporates a non-linear or a piecewise linear transfer function that is inversely related to the parasitic capacitances of the one or more transistors.

Integrated Circuit

Figure 1:
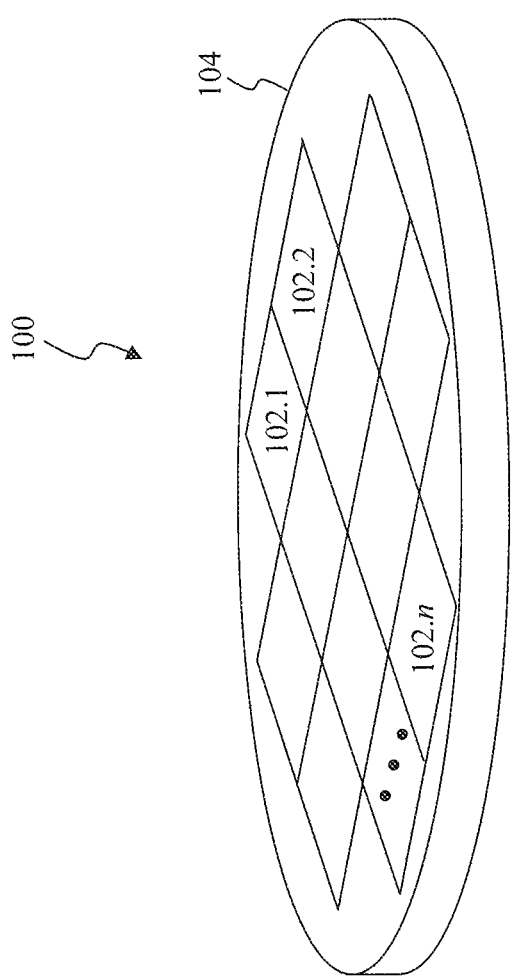
FIG. 1 illustrates a schematic block diagram of a semiconductor wafer according to an exemplary embodiment of the present disclosure.

FIG. 1 illustrates a schematic block diagram of a semiconductor wafer according to an exemplary embodiment of the present disclosure. A semiconductor device fabrication operation is commonly used to manufacture integrated circuits 102.1 through 102.*n* onto a semiconductor substrate 104 to form a semiconductor wafer 100. The semiconductor substrate 104 is typically a thin slice of semiconductor material, such as a silicon crystal, but can include other materials, or combinations of materials, such as sapphire or any other suitable material that will be apparent to those skilled in the relevant art(s) without departing from the spirit and scope of the present disclosure.

The semiconductor device fabrication operation uses a predetermined sequence of photographic and/or chemical processing steps to form the integrated circuits 102.1 through 102.*n* onto the semiconductor substrate 104. Typically, the integrated circuits 102.1 through 102.*n* are formed onto the semiconductor substrate 104 using a first series of fabrication steps, referred to as front-end-of-line processing, and a second series of fabrication steps, referred to as back-end-of-line processing. The front-end-of-line processing represents a first series of photographic and/or chemical processing steps to form components of the integrated circuits 102.1 through 102.n onto the semiconductor substrate 104. The components of the integrated circuits 102.1 through 101n can include any suitable combination of electrical components, mechanical components, electro-mechanical components, or other suitable components that will be apparent to those skilled in the relevant art(s). The back-end-of-line processing represents a second series of photographic and/or chemical processing steps to form interconnections between these components to form the integrated circuits 102.1 through 102.n onto the semiconductor substrate 104.

Exemplary Configuration and Arrangement of the Integrated Circuit

Figure 2:
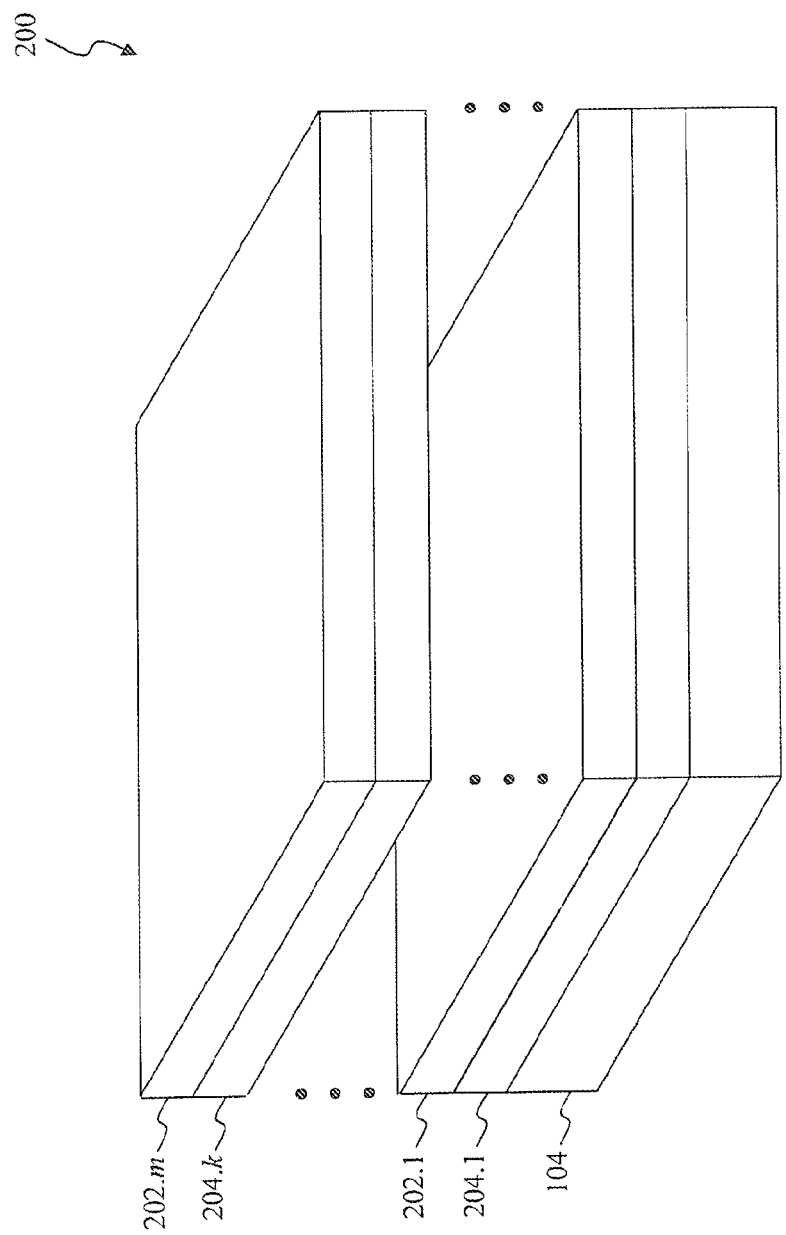
FIG. 2 illustrates an exemplary configuration and arrangement of the integrated circuit according to an exemplary embodiment of the present disclosure.

FIG. 2 illustrates an exemplary configuration and arrangement of the integrated circuit according to an exemplary embodiment of the present disclosure. The semiconductor device fabrication operation forms an integrated circuit 200 onto an arrangement of fabrication layers 202.1 through 202.m that are formed onto the semiconductor substrate 104. The integrated circuit 200 can represent an exemplary embodiment of one or more of the integrated circuits 102.1 through 102.n.

The semiconductor substrate 104 includes one or more n-diffusion and/or p-diffusion layers that are used to form various components, such as electrical components, mechanical components, and/or electro-mechanical components to provide some examples, of the integrated circuit 200. The one or more n-diffusion and/or p-diffusion layers can be formed by implanting or doping the semiconductor substrate 104 with an n-type material and a p-type material, respectively. The n-type material includes impurity atoms of a donor type, such as, but not limited to, phosphorus, arsenic, or antimony to provide some examples, that are capable of donating an electron. The p-type material includes impurity atoms of an acceptor type, such as, but not limited to, boron or aluminum to provide some examples, that are capable of accepting an electron.

The fabrication layers 202.1 through 202.m include one or more polysilicon layers and/or one or more conductive layers to form interconnections between the various components of the integrated circuit 200. The fabrication layers 202.1 through 202.m are interdigitated with insulation layers 204.1 through 204.k, such as silicon dioxide ($SiO_2$) though any other suitable dielectric material that will be apparent to those skilled in the relevant art(s) can be used for the insulation layers without departing from the spirit and scope of the present disclosure.

Figure 3:
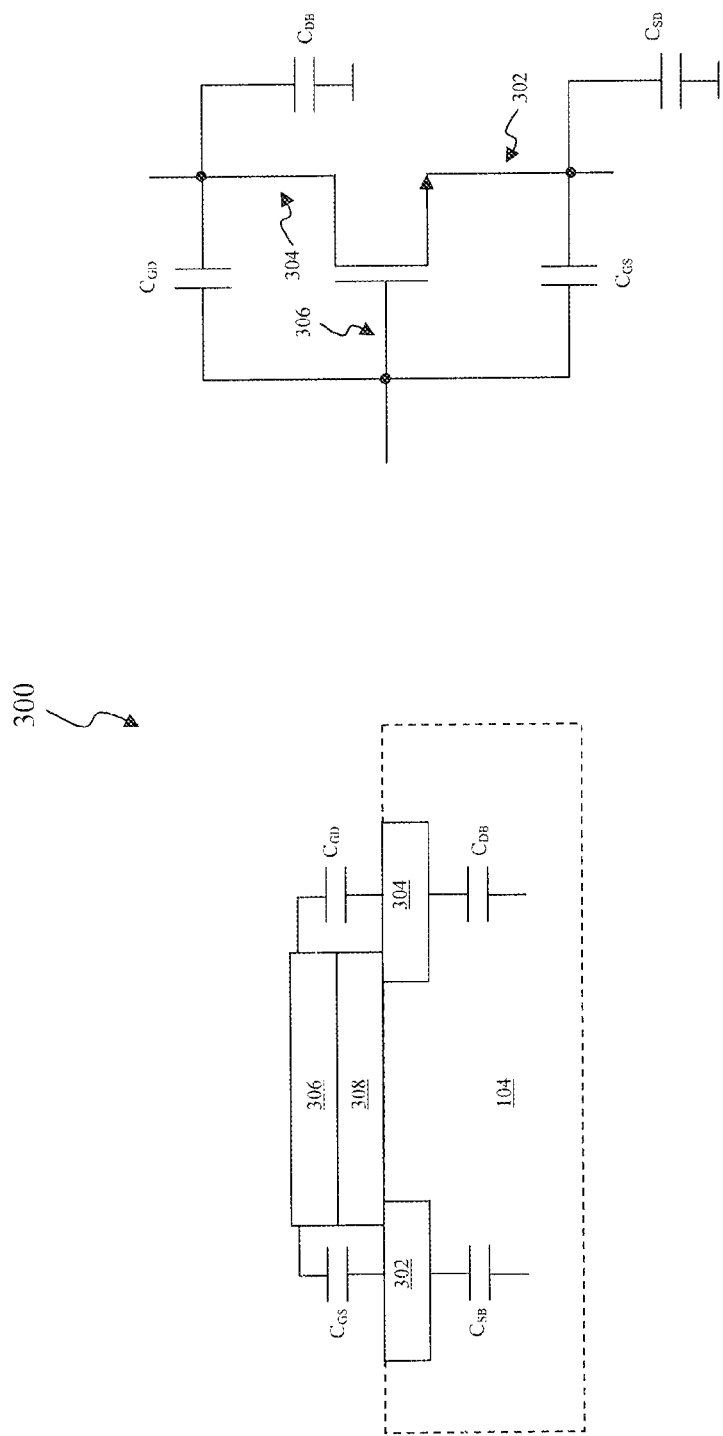
FIG. 3 illustrates an exemplary configuration and arrangement of a transistor within the integrated circuit according to an exemplary embodiment of the present disclosure.

Exemplary Configuration and Arrangement of a Transistor within the Integrated Circuit FIG. 3 illustrates an exemplary configuration and arrangement of a transistor within the integrated circuit according to an exemplary embodiment of the present disclosure. The semiconductor device fabrication operation forms a transistor 300 within an integrated circuit onto an arrangement of fabrication layers, such as the fabrication layers 202.1 through 202.m to provide an example, that are formed onto the semiconductor substrate 104. Although the transistor 300 as illustrated in FIG. 3 represents a n-type metal-oxide-semiconductor transistor (NMOSFET), those skilled in the relevant art(s) will recognize that the integrated circuit can include other types of transistors such as p-type metal-oxide-semiconductor transistors (PMOSFETs), laterally diffused metal oxide semiconductor (LDMOS) transistors, bipolar junction transistors (BJTs), or junction gate field-effect transistors (JFETs) to provide some examples. Although the discussion to follow is described in terms of the NMOSFET, those skilled in the relevant art(s) will recognize that this discussion is also applicable to these other types of transistors without departing from the spirit and scope of the present disclosure.

As illustrated in FIG. 3, the transistor 300 includes a source region 302 and a drain region that are formed in the one or more n-diffusion layers of the semiconductor substrate 104. The transistor 300 also includes a gate region 306 that is formed in a fabrication layer, such as one of the fabrication layers 202.1 through 202.m to provide an example, on a gate oxide region 308 that is formed in an insulation layer, such as one of the insulation layers 204.1 through 204.k to provide an example.

Additionally, the fabrication of the transistor 300 onto the semiconductor substrate 104 introduces unwanted capacitances, often referred to as parasitic capacitances, into the transistor 300. As further illustrated in FIG. 3, these parasitic capacitances can include a parasitic gate-to-source capacitance ($C_{GS}$), a parasitic source-to-bulk capacitance ($C_{SB}$), a parasitic gate-to-drain capacitance ($C_{GD}$), and a parasitic drain-to-bulk capacitance ($C_{DB}$). However, those skilled in the relevant art(s) will recognize that the transistor 300 can also include other parasitic capacitances without departing from the spirit and scope of the present disclosure.

Parasitic Capacitance within the Transistor

The gate-to-source capacitance ($C_{GS}$) represents a parasitic capacitance that results from formation of the source region 302 in the one or more n-diffusion layers of the semiconductor substrate 104 and the gate region 306 in the fabrication layer. This parasitic capacitance represents an unwanted junction capacitance that is dependent on the geometry, for example, overlap between the source region 302 and the gate region 306, of the transistor 300 and the biasing of the transistor 300. The source-to-bulk capacitance ($C_{SB}$) represents a parasitic capacitance that results from formation of the source region 302 in the one or more n-diffusion layers of the semiconductor substrate 104. This parasitic capacitance represents the unwanted capacitance between the source region 302 and the semiconductor substrate 104. The gate-to-drain capacitance ($C_{GD}$) represents a parasitic capacitance that results from formation of the drain region 304 in the one or more n-diffusion layers of the semiconductor substrate 104 and the gate region 306 in the fabrication layer. This parasitic capacitance represents an unwanted junction capacitance that is dependent on the geometry, for example, overlap between the drain region 304 and the gate region 306, of the transistor 300 and the biasing of transistor 300. The drain-to-bulk capacitance ($C_{DB}$) represents a parasitic capacitance that results from formation of the drain region 304 in the one or more n-diffusion layers of the semiconductor substrate 104. This parasitic capacitance represents the unwanted capacitance between the drain region 304 and the semiconductor substrate 104.

Figure 4:
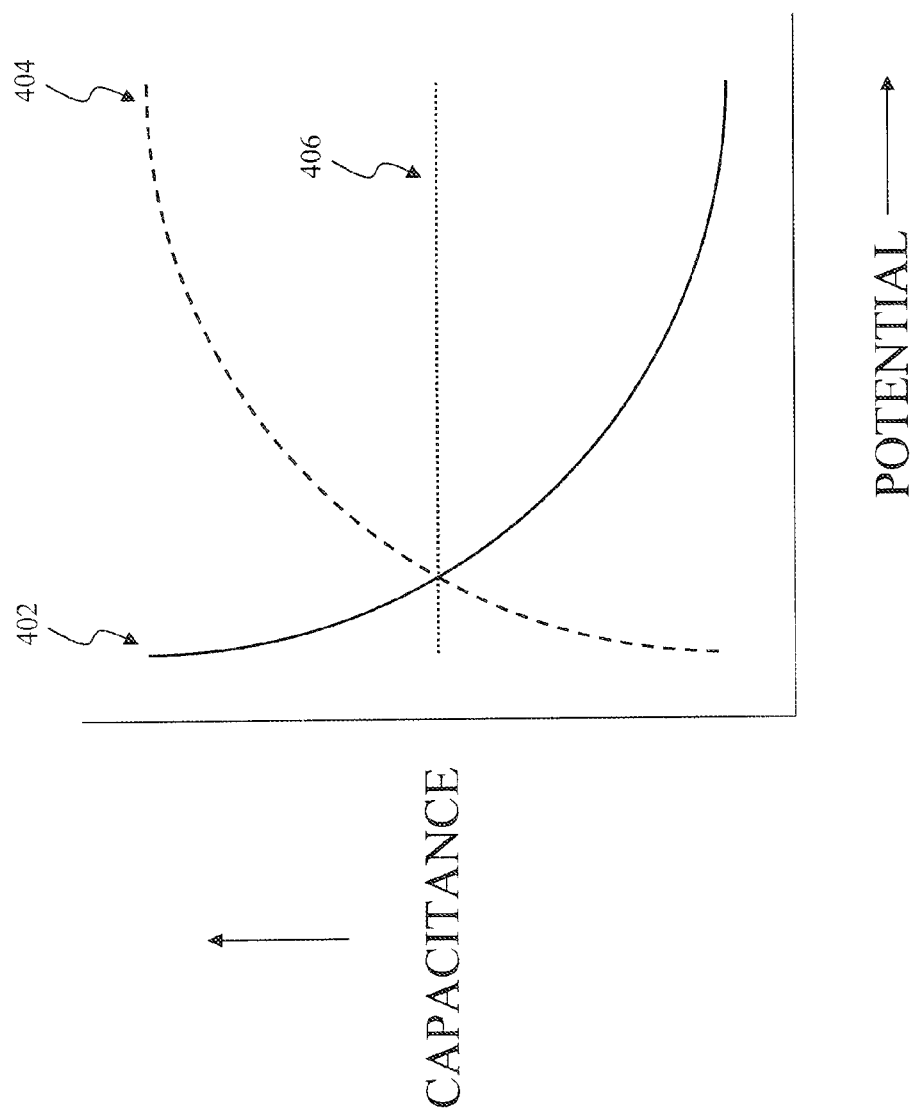
FIG. 4 illustrates an exemplary effect of the parasitic capacitance on the transistor and a compensation module according to an exemplary embodiment of the present disclosure.

Compensation Module According to an Exemplary Embodiment of the Present Disclosure FIG. 4 illustrates an exemplary effect of the parasitic capacitance on the transistor and a compensation module according to an exemplary embodiment of the present disclosure. The capacitance $C_{GS}$, the capacitance $C_{SB}$, capacitance $C_{GD}$, and/or the capacitance $C_{DB}$ represent non-linear capacitances whose capacitances change as the potential difference across these parasitic capacitances change. For example, as illustrated in curve 402 of FIG. 4, the capacitance of these parasitic capacitances can decrease as the potential difference across these parasitic capacitances increases. These parasitic capacitances can affect the overall linearity of the integrated circuit. The linearity of the integrated circuit represents a measure of the extent to which a response of the integrated circuit is directly proportional, i.e., linearly related, to a stimulus applied to the integrated circuit.

As illustrated in curve 404 of FIG. 4, the compensation module of the present disclosure incorporates a non-linear or a piecewise linear transfer function that is inversely related to the parasitic capacitances of transistor 300 as illustrated in curve 402. In an exemplary embodiment, this transfer function can represent a capacitance of the compensation module of the present disclosure. The transfer function increases at a rate that is proportional to the decrease in capacitance of the capacitances of transistor 300 as illustrated in curve 402 as the potential difference across these capacitances increases. However, it should be noted that the curve 404 of FIG. 4 is for illustrative purposes only, those skilled in the relevant art(s) will recognize that other transfer functions are possible without departing from the spirit and scope of the present disclosure. These other transfer functions need not be inversely related to the parasitic capacitances of transistor 300 but can still be implemented to increase the linearity of the integrated circuit.

As illustrated in curve 406 of FIG. 4, the compensation module of the present disclosure, when combined with the parasitic capacitances of transistor 300 as illustrated in curve 402, ideally linearizes the non-linearity caused by the parasitic capacitances of transistor 300. However, in practice, the actual transfer function of the compensation module of the present disclosure can deviate from the ideal transfer function of curve 404. This deviation can cause slight variations, such as a ripple to provide an example, in various regions of the curve 406. In an exemplary embodiment, the compensation module of the present disclosure is arranged to be in a parallel configuration with the parasitic capacitances of transistor 300 such that the transfer function of the compensation module of the present disclosure additively combines with the parasitic capacitances of transistor 300. However, other arrangements are possible as will be recognized by those skilled in the relevant art(s).

Exemplary Configuration and Arrangement of the Compensation Module

Figure 5:
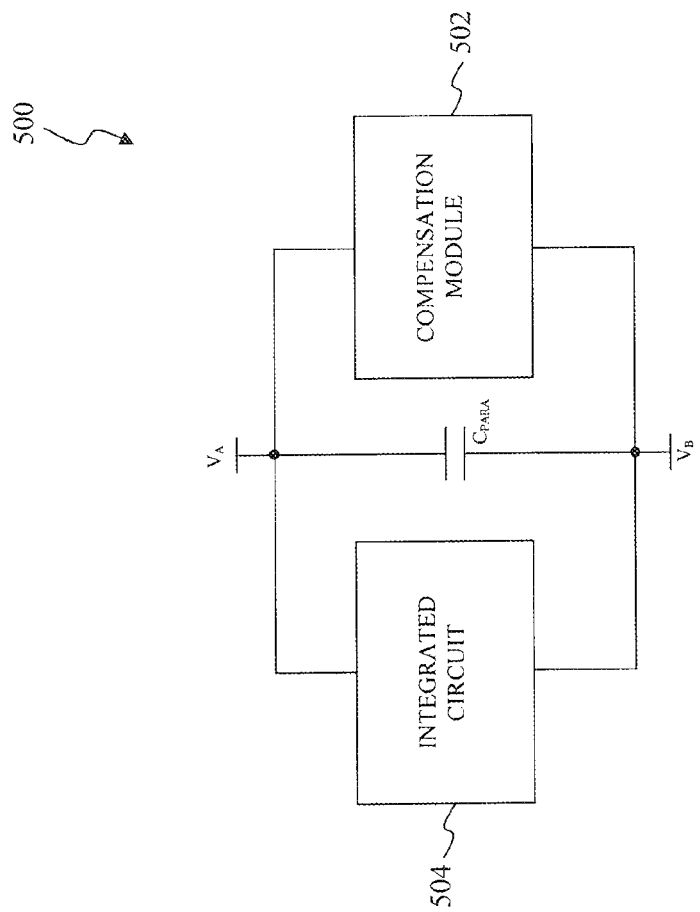
FIG. 5 illustrates an exemplary configuration and arrangement of the compensation module according to an exemplary embodiment of the present disclosure.

FIG. 5 illustrates an exemplary configuration and arrangement of the compensation module according to an exemplary embodiment of the present disclosure. An exemplary configuration and arrangement 500, as illustrated in FIG. 5, includes a compensation module 502 and an integrated circuit 504 that are configured and arranged to be in a parallel configuration such that the transfer function of the compensation module 502 additively combines with the parasitic capacitance $C_{PARA}$ of the integrated circuit 504. However, other arrangements are possible as will be recognized by those skilled in the relevant art(s). For example, the integrated circuit 504 can include multiple transistors, such as multiple transistors 300. In this example, multiple compensation modules 502 can be utilized and wherein each of the multiple compensation modules is in a parallel configuration with a corresponding one or more of the multiple transistors.

The integrated circuit 504 includes any suitable combination of electrical components, mechanical components, electro-mechanical components, or other suitable components that will be apparent to those skilled in the relevant art(s). The parasitic capacitance $C_{PARA}$ of the integrated circuit 504 includes the parasitic capacitance $C_{PARA}$ of these components as well as any parasitic capacitance that can be attributed to interconnections between these components and/or interconnections between the integrated circuit 504 and other integrated circuits. The parasitic capacitance $C_{PARA}$ changes as a potential difference $V_A$-$V_B$ across the parasitic capacitance $C_{PARA}$ changes. For example, the parasitic capacitance $C_{PARA}$ decreases as the potential difference $V_A$-$V_B$ across the parasitic capacitance $C_{PARA}$ increases as discussed in conjunction with FIG. 4.

The compensation module 502 additively combines with the parasitic capacitance $C_{PARA}$ of the integrated circuit 504 to increase the linearity of the integrated circuit 504 as discussed in conjunction with FIG. 4. The compensation module 502 can include multiple switchable impedances, such as one or more switchable resistors, capacitors, and/or inductors to provide an example. Each of these multiple switchable impedances can be, based upon the potential difference $V_A$-$V_B$, selected to provide a non-linear or a piecewise linear transfer function that is inversely related to the parasitic capacitance $C_{PARA}$.

A first configuration of the multiple switchable impedances can be selected for a first potential difference $V_A$-$V_B$ while a second configuration of the multiple switchable impedances is not selected for the first potential difference $V_A$-$V_B$. In this situation, switchable impedances of the first configuration contribute to an impedance of the compensation module 502 while switchable impedances of the second configuration do not contribute to the impedance of the compensation module 502. Whereas for a second potential difference $V_A$-$V_B$ that is greater than the first potential difference $V_A$-$V_B$, the first and the second configurations of the multiple switchable impedances can be selected. In this situation, switchable impedances of the first and the second configurations contribute to the impedance of the compensation module 502. Other configurations of the multiple switchable impedances can be selected in a similar manner for other potential differences $V_A$-$V_B$ to provide the non-linear or the piecewise linear transfer function that is inversely related to the parasitic capacitance $C_{PARA}$. For example, one such other configuration of the multiple switchable impedances can include no switchable impedances for a corresponding potential difference $V_A$-$V_B$.

Exemplary Embodiments of the Compensation Module

Figure 6:
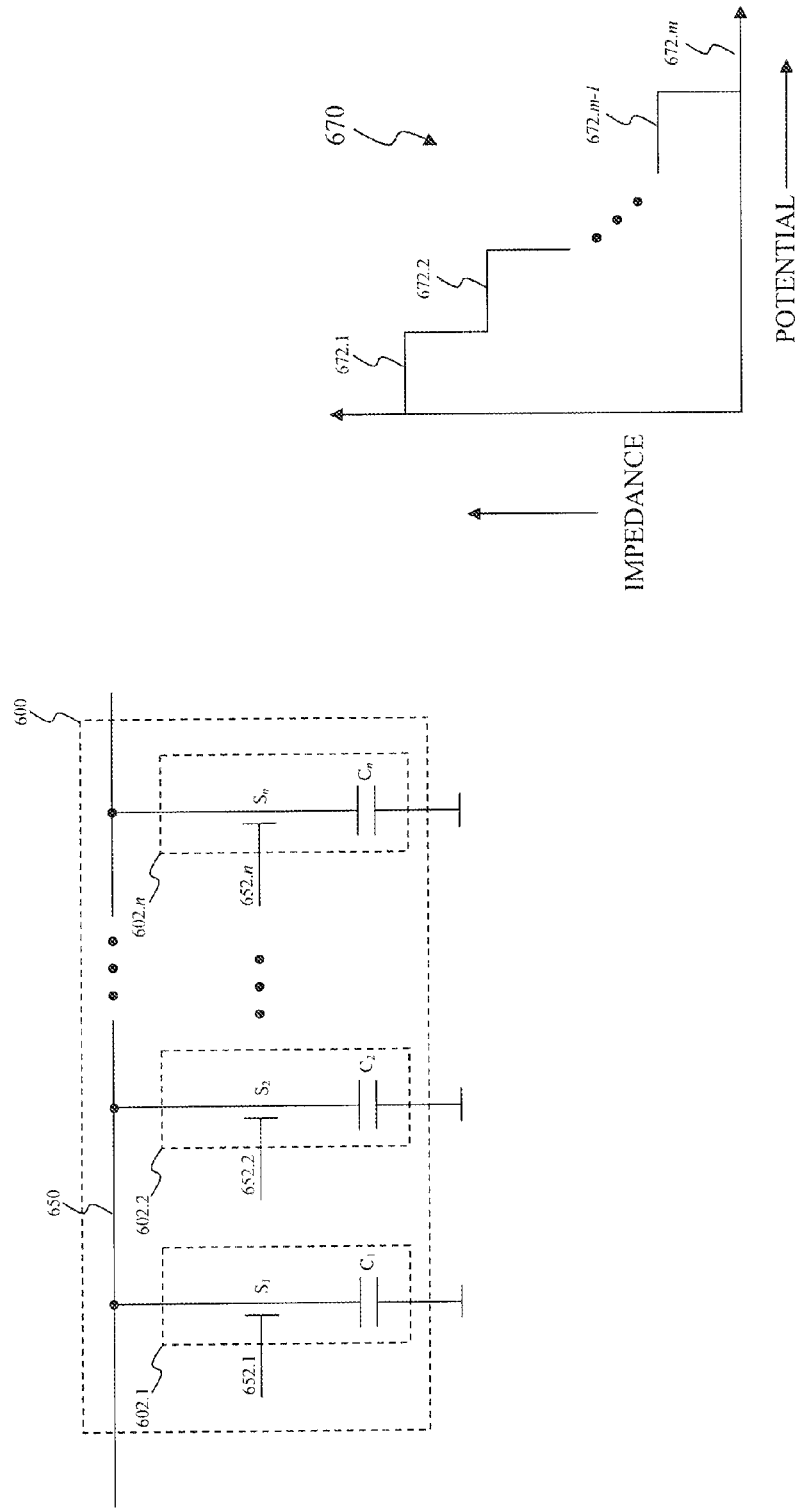
FIG. 6 illustrates a first compensation module according to an exemplary embodiment of the present disclosure.

FIG. 6 illustrates a first compensation module according to an exemplary embodiment of the present disclosure. A compensation module 600 additively combines with a parasitic capacitance of an integrated circuit, such as the integrated circuit 504 to provide an example, to increase the linearity of the integrated circuit. The compensation module 600 includes switchable capacitances 602.1 through 602.$n$. The compensation module 600 can represent an exemplary embodiment of the compensation module 502.

As illustrated in FIG. 6, the switchable capacitances 602.1 through 602.$n$ are coupled to an output 650 of the integrated circuit or to an output of a transistor, such as the transistor 300 to provide an example, and are arranged to be in a parallel configuration. Each of the switchable capacitances 602.1 through 602.$n$ includes a corresponding switching element from among switching elements $S_1$ through $S_n$ coupled to a corresponding passive element from among capacitors $C_1$ through $C_n$. In an exemplary embodiment, the capacitors $C_1$ through $C_n$ can be binary weighted. Although the switchable capacitances 602.1 through 602.$n$ are illustrated as including the capacitors $C_1$ through $C_n$ in FIG. 6, those skilled in the relevant art(s) will recognize that the switchable capacitances 602.1 through 602.*n* can include other passive elements, such as resistors, capacitors, and/or inductors without departing from the spirit and scope of the present disclosure. These other passive elements can be coupled to a corresponding switching element from among switching elements $S_1$ through $S_n$ or the switchable capacitances 602.1 through 602.*n* and can include additional switching elements coupled to these other passive elements.

The switching elements $S_1$ through $S_n$ can be implemented using n-type metal-oxide-semiconductor transistors (NMOSFETs), p-type metal-oxide-semiconductor transistors (PMOSFETs), laterally diffused metal oxide semiconductor (LDMOS) transistors, bipolar junction transistors (BJTs), junction gate field-effect transistors (JFETs), or any combination thereof.

As illustrated in FIG. 6, various configurations of the switchable capacitances 602.1 through 602.*n* can be dynamically selected to provide a non-linear or a piecewise linear transfer function that is inversely related to a parasitic capacitance, such as the parasitic capacitance $C_{PARA}$ to provide an example, of the integrated circuit or of the transistor. A first configuration of the switchable capacitances 602.1 through 602.*n* can be selected for a first potential difference across the parasitic capacitance $C_{PARA}$ that includes selecting all of the switchable capacitances 602.1 through 602.*n* as indicated by portion 672.1 of a transfer function curve 670 for a transfer function of the compensation module 600. In this first configuration, a capacitance of the compensation module 600 is at a first value. Likewise, a second configuration of the switchable capacitances 602.1 through 602.*n* can be selected for a second potential difference across the parasitic capacitance $C_{PARA}$ that includes selecting all but one of the switchable capacitances 602.1 through 602.*n* as indicated by portion 672.2 of the transfer function curve 670. The second potential is typically greater than the first potential. Next, an m−1$^{th}$ configuration of the switchable capacitances 602.1 through 602.*n* can be selected for an m−1$^{th}$ potential difference across the parasitic capacitance $C_{PARA}$ that includes selecting one of the switchable capacitances 602.1 through 602.*n* as indicated by portion 672.*m*−1 of the transfer function curve 670. Finally, an m$^{th}$ configuration of switchable capacitances 602.1 through 602.*n* can be selected for an m$^{th}$ potential difference across the parasitic capacitance $C_{PARA}$ that includes selecting none of the switchable capacitances 602.1 through 602.*n* as indicated by portion 672.*m* of the transfer function curve 670. In this m$^{th}$ configuration, the capacitance of the compensation module 600 is at its minimum value. As illustrated in FIG. 6, the potential differences across the parasitic capacitance $C_{PARA}$ corresponding to the portions 672.1 through 672.*m* are uniformly, or substantially uniformly, spaced; however other spacing is possible as will be recognized by those skilled in the relevant art(s).

The selection of the switchable capacitances 602.1 through 602.*n* can be achieved by activating and/or deactivating corresponding capacitance control lines 652.1 through 652.*n*. For example, the switchable capacitance 602.1 can be selected by activating the capacitance control line 652.1. In an exemplary embodiment, the capacitance control lines 652.1 through 652.*n* represent digital control lines. This exemplary embodiment is most often implemented when a magnitude of the output 650 is a priori known or can be reliably estimated. This situation often occurs in half-duplex and/or full-duplex communication systems and can be more difficult to implement in the full-duplex communication system where the magnitude of the received signal can be difficult to reliably estimate.

In another exemplary embodiment, the switching elements $S_1$ through $S_n$ can be implemented using NMOSFETs. In this situation, the capacitance of the compensation module 600 decreases as the potential difference across the parasitic capacitance $C_{PARA}$ increases. More of the switchable capacitances 602.1 through 602.*n* are deactivated as the potential difference across the parasitic capacitance $C_{PARA}$ increases. In this other exemplary embodiment, the NMOSFETs generally operate as switches, namely the NMOSFETs are activated to couple their corresponding capacitors $C_1$ through $C_n$ to the output 650 or deactivated to decouple their corresponding capacitors $C_1$ through $C_n$ from the output 650. The gates of these NMOSFETs are typically coupled to a specific biasing voltage, such as a direct current (DC) voltage to provide an example. This allows these NMOSFETs to be activated and/or deactivated based upon their gate-to-source voltages ($V_{GS}$). For example, if the $V_{GS}$ of a corresponding NMOSFET from among these NMOSFETs is greater than its corresponding threshold voltage ($V_t$), then the corresponding NMOSFET will be activated. As another example, if the $V_{GS}$ of the corresponding NMOSFET is less than its $V_t$, then the corresponding NMOSFET will be deactivated. As these examples demonstrate, the NMOSFETs can be controlled, namely, activated and/or deactivated, by controlling their respective gate-to-source voltages. For example, when the potential of the output 650 changes so does the respective gate-to-source voltages of the NMOSFETs. By selectively choosing the gate voltages for the NMOSFETs, the gate-to-source voltages of the NMOSFETs also determines when each of the NMOSFETs is to be activated and/or deactivated.

In a further exemplary embodiment, the switching elements $S_1$ through $S_n$ can be implemented using PMOSFETs. In this situation, the capacitance of the compensation module 600 increases as the potential difference across the parasitic capacitance $C_{PARA}$ increases. More of the switchable capacitances 602.1 through 602.*n* are activated as the potential difference across the parasitic capacitance $C_{PARA}$ increases. Accordingly, it can be beneficial to include two of the compensation modules 600, namely a first compensation module 600 implemented using NMOSFETs and a second compensation module 600 implemented using PMOSFETs with the first compensation module 600 and the second compensation module 600 being in a parallel configuration. This allows for the capacitance of the compensation module 600 to be both increased and decreased as the potential difference across the parasitic capacitance $C_{PARA}$ increases to provide a non-monotonic transfer function for the compensation module 600.

Figure 7:
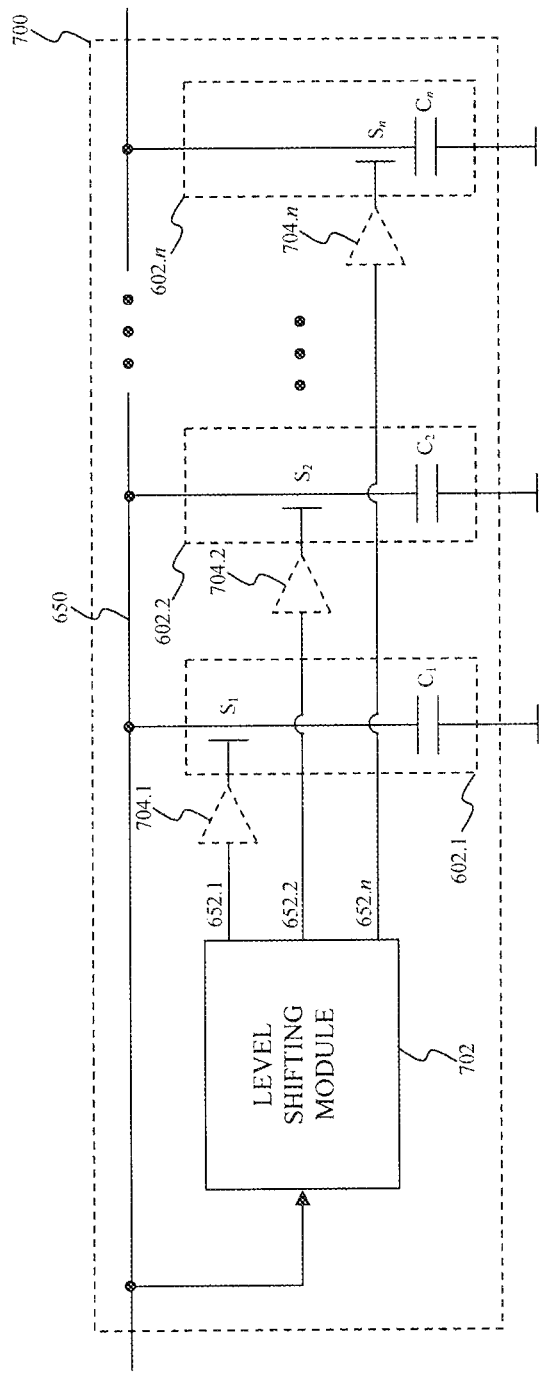
FIG. 7 illustrates a second compensation module according to an exemplary embodiment of the present disclosure.

FIG. 7 illustrates a second compensation module according to an exemplary embodiment of the present disclosure. A compensation module 700 additively combines with a parasitic capacitance of an integrated circuit, such as the integrated circuit 504 to provide an example, to increase the linearity of the integrated circuit. The compensation module 700 includes the switchable capacitances 602.1 through 602.*n*, an optional level shifting module 702, and optional amplifiers 704.1 through 704.*n*. The compensation module 700 can represent an exemplary embodiment of the compensation module 502. The compensation module 700 includes many similar features as the compensation module 700; therefore, only differences between the compensation module 600 and the compensation module 700 are discussed below.

Each of the switching elements $S_1$ through $S_n$ has a corresponding threshold voltage that determines when to activate the corresponding switching element $S_1$ through $S_n$. The optional level shifting module 702 can be used to shift the output 650 higher or lower to provide the capacitance control lines 652.1 through 652.n. For example, the optional level shifting module 702 can shift the output 650 to provide a first control line, or a first group of control lines, from among the capacitance control lines 652.1 through 652.n, with sufficient energy to cause a corresponding gate-to-source voltage ($V_{GS}$) of its corresponding switching element $S_1$ through $S_n$ to be greater than its corresponding threshold voltage. In this example, the corresponding switching element $S_1$ through $S_n$ is activated. As another example, the optional level shifting module 702 can shift the output 650 to provide a second control line, or a second group of control lines, from among the capacitance control lines 652.1 through 652.n, with insufficient energy to cause a corresponding gate-to-source voltage ($V_{GS}$) of its corresponding switching element $S_1$ through $S_n$ to be lesser than its corresponding threshold voltage. In this example, the corresponding switching element $S_1$ through $S_n$ is deactivated. In another exemplary embodiment, the optional level shifting module 702 can be implemented using a parallel arrangement of n high pass filters to filter the output 650 to provide the capacitance control lines 652.1 through 652.n.

The optional amplifiers 704.1 through 704.n can amplify the capacitance control lines 652.1 through 652.n to effectively decrease transition time, for example, time required to activate and/or deactivate, of the switching elements $S_1$ through $S_n$. In an exemplary embodiment, the optional amplifiers 704.1 through 704.n can be implemented using complementary metal-oxide-semiconductor (CMOS) inverters. In this exemplary embodiment. If the optional amplifiers 704.1 through 704.n have sufficient gain, these optional amplifiers will provide an output at a maximum logic level when a voltage less than, for an inverting amplifier, or greater than, for a non-inventing amplifier, the threshold voltages of the optional amplifiers 704.1 through 704.n is applied to their inputs. Otherwise, these optional amplifiers will provide an output at a minimum logic level when a voltage greater than the threshold voltages of the optional amplifiers 704.1 through 704.n is applied to their inputs. As a result, the activation and/or deactivation of the switching elements $S_1$ through $S_n$ is dependent upon the threshold voltages of the optional amplifiers 704.1 through 704.n, which for CMOS inverters is approximately one half of a supply voltage, depending implementation of the FETs for the CMOS inverters. In an exemplary embodiment, the optional level shifting module 702 is used when the optional amplifiers 704.1 through 704.n have substantially similar threshold voltages. This allows each of the optional amplifiers 704.1 through 704.n to be selectively activated and/or deactivated by simply varying the output 650. In this exemplary embodiment, the optional amplifiers 704.1 through 704.n causes their switching elements $S_1$ through $S_n$ to activate and/or deactivate faster as the output 650 changes to better approximate ideal switches.

Exemplary Integrated Circuit Including the Compensation Module

A digital-to-analog converter (DAC) is an electronic circuit that converts a digital input signal from a digital representation in a digital signaling domain to an analog representation in the analog signaling domain to provide an analog output signal. DACs can be designed for a wide range of applications, including general data acquisition applications and special applications, such as, but not limited to, video or graphic outputs, high definition video displays, ultra high-speed signal processing, and digital video recording. A current DAC represents a type of DAC that performs this conversion in a current domain. For example, the current-steering DAC includes a plurality of current sources, typically one for each bit of the digital input signal, that are arranged in parallel. The plurality of current sources are either steered or activated and/or deactivated in accordance with the digital input signal to provide an analog representation of the digital input signal as the analog output signal.

Figure 8:
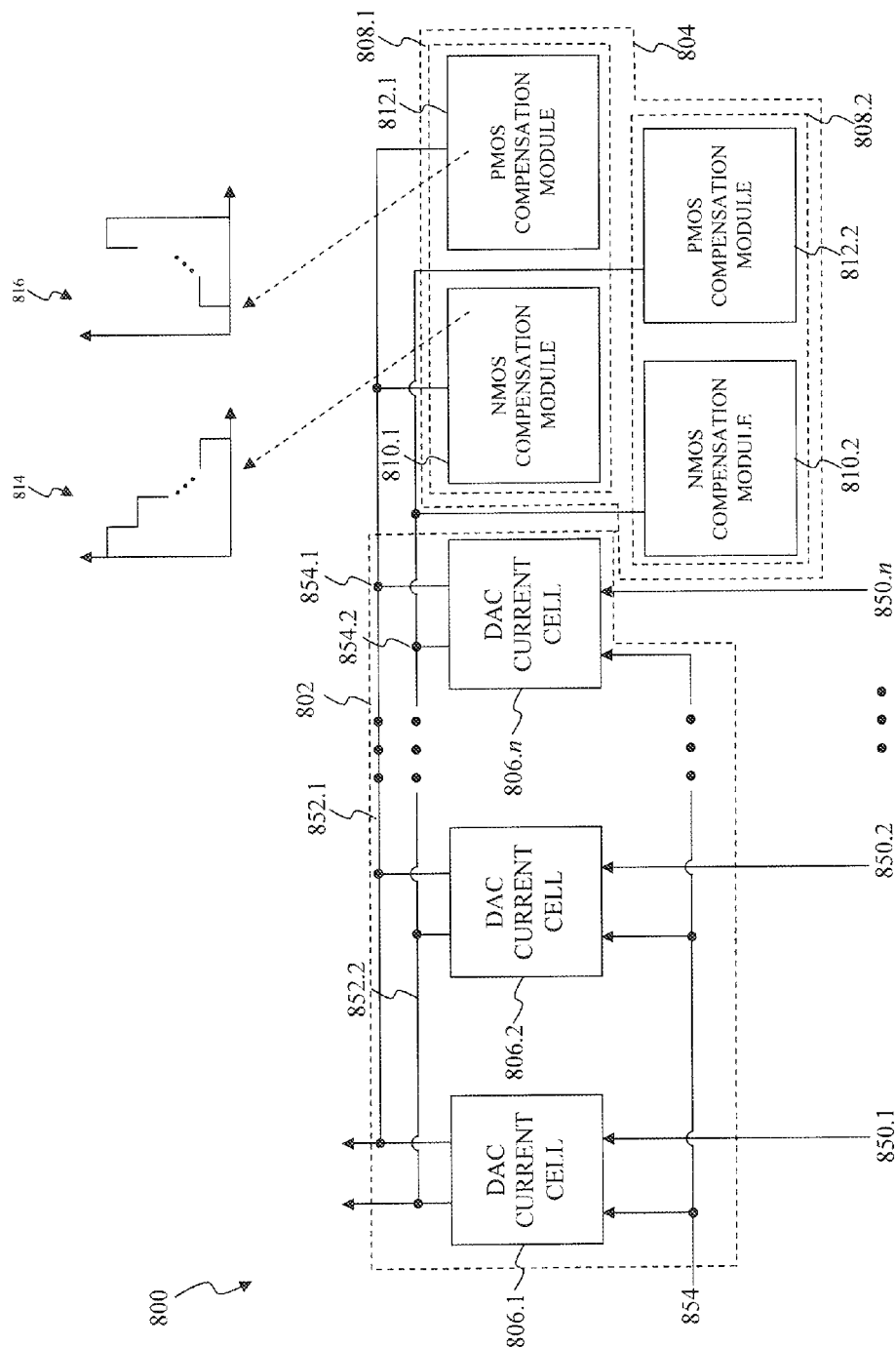
FIG. 8 illustrates a block diagram of a DAC according to an exemplary embodiment of the present disclosure.

FIG. 8 illustrates a block diagram of a DAC according to an exemplary embodiment of the present disclosure. A DAC 800 represents an interface between a digital signaling domain and an analog signaling domain. The DAC 800 converts a digital input signal 850 from a digital representation in the digital signaling domain to an analog representation in the analog signaling domain to provide an analog output signal 852. The digital input signal 850 includes M bits represented by bits 850.1 through 850.n, where the digital input signal 850.n represents a most significant bit (MSB) of the digital input signal 850 and the digital input signal 850.1 represents a least significant bit (LSB) of the digital input signal 850. The DAC 800 includes a current steering DAC 802 and a compensation module 804. The current steering DAC 802 and the compensation module 804 can represent an exemplary embodiment of the integrated circuit 504 and the compensation module 502, respectively.

As illustrated in FIG. 8, the DAC 800 includes DAC current cells 806.1 through 806.n. In an exemplary embodiment, the DAC current cells 806.1 through 806.n can be implemented to firm a Class-A DAC. In this exemplary embodiment, the DAC current cells 806.1 through 806.n are steered in either a first direction or a second direction in accordance with the digital input signal bits 850.1 through 850.n. The DAC current cells 806.1 through 806.n include multiple current sources that are steerable in response to the digital input signal bits 850.1 through 850.n to provide an analog representation of the digital input signal bits 850.1 through 850.n as the analog output signal 852. Those current sources from among the multiple current sources that are steered in the first direction contribute their corresponding currents to the analog output signal 852.1 while those current sources from among the multiple current sources that are steered in the second direction contribute their corresponding currents to the analog output signal 852.2. For example, those current sources from among the multiple current sources that are steered in the first direction contribute their corresponding currents to a summation node 854.1 to provide the analog output signal 852.1 while those current sources from among the multiple current sources that are steered in the second direction contribute their corresponding currents to a summation node 854.2 to provide the analog output signal 852.2.

In another exemplary embodiment the DAC current cells 806.1 through 806.n can be implemented to form a Class-B DAC. In this exemplary embodiment, the DAC current cells 806.1 through 806.n include multiple current sources that are selectively activated and/or deactivated in response to the digital input signal bits 850.1 through 850.n to provide an analog representation of the digital input signal bits 850.1 through 850.n as the analog output signal 852. Those current sources from among the multiple current sources that are activated contribute their corresponding currents to the analog output signals 852.1 and 852.2 while those current sources from among the multiple current sources that are deactivated do not contribute their corresponding currents to the analog output signals 852.1 and 852.2.

The compensation module 804 additively combines with the parasitic capacitance of the DAC current, cells 806.1 through 806.$n$ at the summation nodes 854.1 and 854.2 to increase the linearity of the DAC 800. Although not shown in FIG. 8, the DAC 800 can alternatively include multiple compensation modules 804. In this alternative, each of these multiple compensation modules 804 additively combine with the parasitic capacitance of a corresponding DAC current cell from among the DAC current cells 806.1 through 806.$n$ to increase the linearity of the corresponding DAC current cell. It should be noted that the compensation module 804 can be located at any suitable location within the DAC 800 as will be apparent to those skilled in the relevant art(s) without departing from the spirit and scope of the present location.

As further illustrated in FIG. 8, the analog output signal 852 can represent a differential signal including a first analog output signal 852.1 that is a complement of a second analog output signal 852.2. As such, the compensation module 804 includes a first compensation module 808.1 and a second compensation module 808.2. The first compensation module 808.1 combines with the parasitic capacitance of the DAC current cells 806.1 through 806.$n$ to increase the linearity of the first analog output signal 852.1 while the second compensation module 808.2 combines with the parasitic capacitance of the DAC current cells 806.1 through 806.$n$ to increase the linearity of the second analog output signal 852.2. The first compensation module 808.1 includes an NMOS compensation module 810.1 and a PMOS compensation module 812.1 and the second compensation module 808.2 includes an NMOS compensation module 810.2 and a PMOS compensation module 812.2. The NMOS compensation module 810.1 and the NMOS compensation module 810.2 allow for the capacitance of the first compensation module 808.1 and the second compensation module 808.2, respectively, to be decreased as illustrated in curve 814. This decrease in capacitance is achieved by deactivating more switchable capacitors within the NMOS compensation module 810.1 and/or the NMOS compensation module 810.2. The PMOS compensation module 812.1 and the PMOS compensation module 812.2 allow for the capacitance of the first compensation module 808.1 and the second compensation module 808.2, respectively, to be increased as illustrated in curve 816. This increase in capacitance is achieved by activating more switchable capacitors within the PMOS compensation module 812.1 and/or the PMOS compensation module 812.2.

Figure 9:
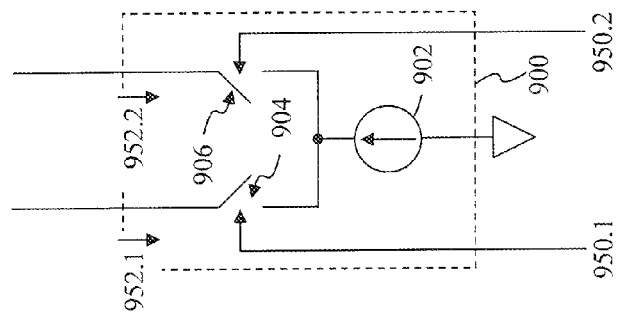
FIG. 9 illustrates a first block diagram of an exemplary current cell that can be implemented within the DAC according to an exemplary embodiment of the present disclosure.

FIG. 9 illustrates a first block diagram of an exemplary current cell that can be implemented within the DAC according to an exemplary embodiment of the present disclosure. A DAC current cell 900 is steered in either the first direction or the second direction in accordance with a corresponding digital input signal bit from among multiple digital input signal bits, such as a corresponding digital bit from among the digital input signal bits 850.1 through 850.$n$ to provide an example. As illustrated in FIG. 9, the DAC current cell 900 includes a steerable current source 902, a first switchable transistor 904, and a second switchable transistor 906. The DAC current cell 900 can represent an exemplary embodiment of one or more of the DAC current cells 806.1 through 806.$n$.

The DAC current cell 900 is steered in either the first direction or the second direction in accordance with digital input signal bits 950.1 through 950.2 with the digital input signal bit 950.1 being a complement of the digital input signal bit 950.2. The DAC current cell 900 sinks a DAC cell current 952.1 when steered in the first direction or sinks a DAC cell current 952.2 when steered in the second direction. The first switchable transistor 904 provides the DAC cell current 952.1 from the analog output current to the steerable current source 902 when closed in response to the digital input signal bit 950.1. Similarly, the second switchable transistor 906 provides the DAC cell current 952.2 from the analog output current to the steerable current source 902 when closed in response to the digital input signal bit 950.2. Typically, the first switchable transistor 904 and the second switchable transistor 906 are closed or switched in a complementary manner by the digital input signal bits 950.1 and 950.2 such that only one of these switches is closed at any given instance in time.

Figure 10:
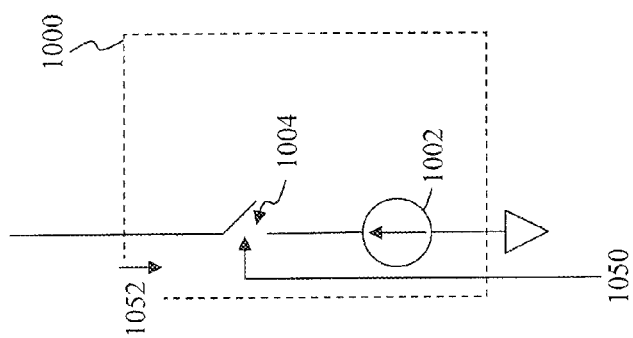
FIG. 10 illustrates a second block diagram of an exemplary current cell that can be implemented within the DAC according to an exemplary embodiment of the present disclosure.

FIG. 10 illustrates a second block diagram of an exemplary current cell that can be implemented within the DAC according to an exemplary embodiment of the present disclosure. A DAC current cell 1000 includes one or more current sources that are selectively activated and/or deactivated in response to a corresponding digital input signal bit from among multiple digital input signal bits, such as a corresponding digital bit from among the digital input signal bits 850.1 through 850.$n$ to provide an example. As illustrated in FIG. 10, the DAC current cell 1000 includes a current source 1002 and a switchable transistor 1004. The DAC current cell 1000 can represent an exemplary embodiment of one or more of the DAC current cells 806.1 through 806.$n$. As illustrated in FIG. 10, the DAC current cell 1000 provides a current from the first current source 1002 in accordance with digital input signal bit 1050. The switchable transistor 1004 provides the DAC cell current 1052 from the analog output current to the current source 1002 when closed in response to the digital input signal bit 1050.

CONCLUSION

The following Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A digital-to-analog converter (DAC) for converting a digital input signal from a digital representation in a digital signaling domain to an analog representation in an analog signaling domain to provide an analog output signal, comprising:
a plurality of DAC current cells, having a plurality of transistors, configured to convert the digital input signal to the analog output signal; and
a compensation module, having a transfer function, coupled to the plurality of transistors,
wherein the transfer function is inversely related to a parasitic capacitance of the plurality of transistors.

2. The DAC of claim 1, wherein the compensation module comprises:
a first compensation module, having a first plurality of switchable impedances, configured to deactivate one or more of the first plurality of switchable impedances to increase a capacitance of the compensation module; and
a second compensation module, having a second plurality of switchable impedances, configured to deactivate one or more of the second plurality of switchable impedances to decrease the capacitance of the compensation module.

3. The DAC of claim 2, wherein the first plurality of switchable impedances comprises;
a first plurality of capacitors; and
a first plurality of switching elements, each of the first plurality of switching elements being coupled to a corresponding capacitor from among the first plurality of capacitors, and
wherein the second plurality of switchable impedances comprises:
a second plurality of capacitors; and
a second plurality of switching elements, each of the second plurality of switching elements being coupled to a corresponding capacitor from among the second plurality of capacitors.

4. The DAC of claim 3, wherein the first plurality of switching elements comprises:

a plurality of n-type metal-oxide-semiconductor transistors (NMOSFETs), each of the plurality of NMOSFETs being coupled to the corresponding capacitor from among the first plurality of capacitors, and
wherein the second compensation module comprises:
a plurality of p-type metal-oxide-semiconductor transistors (PMOSFETs), each of the plurality of PMOSFETs being coupled to the corresponding capacitor from among the second plurality of capacitors.

5. The DAC of claim 1, wherein the analog output signal is a differential analog output signal including a first analog output signal and a second analog output signal, and
wherein the compensation module comprises:
a first compensation module configured to adjust a linearity of the first analog output signal, and
a second compensation module configured to adjust a linearity of the second analog output signal.

6. The DAC of claim 1, wherein the compensation module comprises a plurality of switchable impedances,
wherein a first configuration of the plurality of switchable impedances is selected for a first potential difference associated with the parasitic capacitance of the plurality of transistors, and
wherein a second configuration of the plurality of switchable impedances is selected for a second potential difference associated with the parasitic capacitance of the plurality of transistors, the second potential difference being greater than the first potential difference.

7. The DAC of claim 1, wherein the compensation module is further configured and arranged to be in a parallel configuration with the plurality of transistors.

8. An electronic circuit, comprising:
an integrated circuit that is formed onto a semiconductor substrate using a semiconductor fabrication process, the formation of the integrated circuit onto the semiconductor substrate introducing a parasitic capacitance into the integrated circuit; and
a compensation module, having a transfer function, coupled to the integrated circuit,
wherein the transfer function is inversely related to the parasitic capacitance of the integrated circuit.

9. The electronic circuit of claim 8, wherein the compensation module comprises:
a first compensation module, having a first plurality of switchable impedances, configured to deactivate one or more of the first plurality of switchable impedances to increase a capacitance of the compensation module; and
a second compensation module, having a second plurality of switchable impedances, configured to deactivate one or more of the second plurality of switchable impedances to decrease the capacitance of the compensation module.

10. The electronic circuit of claim 9, wherein the first compensation module comprises:
a plurality of n-type metal-oxide-semiconductor transistors (NMOSFETs), each of the plurality of NMOSFETs being coupled to a corresponding switchable impedance from among the first plurality of switchable impedances, and
wherein the second compensation module comprises:
a plurality of p-type metal-oxide-semiconductor transistors (PMOSFETs), each of the plurality of PMOSFETs being coupled to a corresponding switchable impedance from among the second plurality of switchable impedances.

11. The electronic circuit of claim 8, wherein the compensation module comprises:
a plurality of switchable impedances,
wherein a first configuration of the plurality of switchable impedances is selected for a first potential difference associated with the parasitic capacitance of the integrated circuit, and
wherein a second configuration of the plurality of switchable impedances is selected for a second potential difference associated with the parasitic capacitance of the integrated circuit, the second potential difference being greater than the first potential difference.

12. The electronic circuit of claim 8, wherein the compensation module is further configured and arranged to be in a parallel configuration with the plurality of transistors.

13. The electronic circuit of claim 8, wherein the parasitic capacitance of the integrated circuit comprises:
a parasitic gate-to-source capacitance ($C_{GS}$) of one or more transistors of the integrated circuit;
a parasitic source-to-bulk capacitance ($C_{SB}$) of the one or more transistors;
a parasitic gate-to-drain capacitance ($C_{GD}$) of the one or more transistors; or
a parasitic drain-to-bulk capacitance ($C_{DB}$) of the one or more transistors.

14. The electronic circuit of claim 8, wherein the transfer function comprises:
a non-linear or a piecewise linear transfer function that is inversely related to the parasitic capacitance of the integrated circuit.

15. A compensation module for additively combining with a parasitic capacitance of an integrated circuit, comprising:
a first compensation module, having a first plurality of switchable impedances, configured to deactivate one or more of the first plurality of switchable impedances to increase a capacitance of the compensation module; and
a second compensation module, having a second plurality of switchable impedances, configured to deactivate one or more of the second plurality of switchable impedances to decrease the capacitance of the compensation module.

16. The compensation module of claim 15, wherein the first compensation module comprises:
a plurality of n-type metal-oxide-semiconductor transistors (NMOSFETs), each of the plurality of NMOSFETs being coupled to a corresponding switchable impedance from among the first plurality of switchable impedances, and
wherein the second compensation module comprises:
a plurality of p-type metal-oxide-semiconductor transistors (PMOSFETs), each of the plurality of PMOSFETs being coupled to a corresponding switchable impedance from among the second plurality of switchable impedances.

17. The compensation module of claim 15, wherein a first configuration of the first plurality of switchable impedances is selected for a first potential difference associated with the parasitic capacitance of the integrated circuit,
wherein a second configuration of the first plurality of switchable impedances is selected for a second potential difference associated with the parasitic capacitance of the integrated circuit, the second potential difference being greater than the first potential difference, and
wherein a capacitance of the first configuration of the first plurality of switchable impedances is less than a capacitance of the second configuration of the first plurality of switchable impedances.

18. The compensation module of claim 17, wherein a first configuration of the second plurality of switchable impedances is selected for the first potential difference associated with the parasitic capacitance of the integrated circuit,
wherein a second configuration of the second plurality of switchable impedances is selected for the second potential difference associated with the parasitic capacitance of the integrated circuit, and
wherein a capacitance of the first configuration of the second plurality of switchable impedances is greater than a capacitance of the second configuration of the second plurality of switchable impedances.

19. The compensation module of claim 15, wherein the compensation module is further configured and arranged to be in a parallel configuration with the integrated circuit.

20. The compensation module of claim 19, wherein a transfer function of the first and the second compensation modules is inversely related to the parasitic capacitance of the integrated circuit.

* * * * *